United States Patent [19]
Diem et al.

[11] Patent Number: 5,780,885
[45] Date of Patent: Jul. 14, 1998

[54] ACCELEROMETERS USING SILICON ON INSULATOR TECHNOLOGY

[75] Inventors: Bernard Diem, Echirolles; Marie-Therese Delaye, Grenoble, both of France

[73] Assignee: Commissariat a l'Energie Atomique, Paris, France

[21] Appl. No.: 698,066

[22] Filed: Aug. 15, 1996

Related U.S. Application Data

[62] Division of Ser. No. 172,827, Dec. 27, 1993, Pat. No. 5,576,250.

[30] Foreign Application Priority Data

Dec. 28, 1992 [FR] France .................. 92 15771

[51] Int. Cl.$^6$ .................................................. H01L 29/82
[52] U.S. Cl. .................. 257/254; 257/417; 257/418; 257/420; 73/514.21; 73/514.22; 73/514.23; 73/DIG. 1; 73/DIG. 4
[58] Field of Search .................... 257/417, 418, 257/419, 420, 254; 73/DIG. 1, 514.02, DIG. 4, 514.21, 514.22, 514.23, 514.24, 514.34, 514.36, 514.37, 514.38

[56] References Cited

U.S. PATENT DOCUMENTS 5,006,487  4/1991  Stokes ............................ 437/228
5,381,300  1/1995  Thomas et al. .................. 361/280
5,500,549  3/1996  Takeuchi et al. ................ 257/415
5,572,057  11/1996 Yamamoto et al. .............. 257/417

OTHER PUBLICATIONS

Rudolf et al, "Precision Accelerometers with Mg Resolution", Sensors and Actuators, A21–A23, 1990, pp. 297–302.

Harendt et al, "Wafer Bonding and its Application to Silicon-on-Insulator Fabrication," Technical Digest HHE '90, 2nd Workshop, Berlin, 1990, pp. 1–6.

Primary Examiner—William Mintel
Attorney, Agent, or Firm—Oblon, Spivak, McClelland, Maier & Neustadt, P.C.

[57] ABSTRACT

Process for the production of accelerometers using the silicon on insulator method. The process comprises the following stages: a) producing a conductive monocrystalline silicon film on a silicon substrate and separated from the latter by an insulating layer; b) etching the silicon film and the insulating layer up to the substrate in order to fix the shape of the mobile elements and the measuring device; c) producing electric contacts for the measuring devices; d) partial elimination of the insulating layer in order to free the mobile elements, the remainder of the insulating layer rendering integral the substrate and the moving elements.

7 Claims, 7 Drawing Sheets

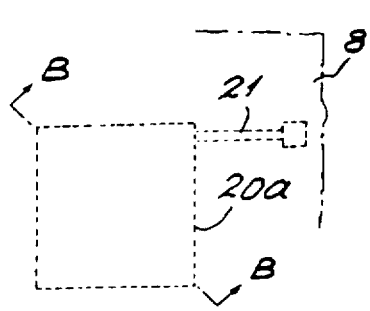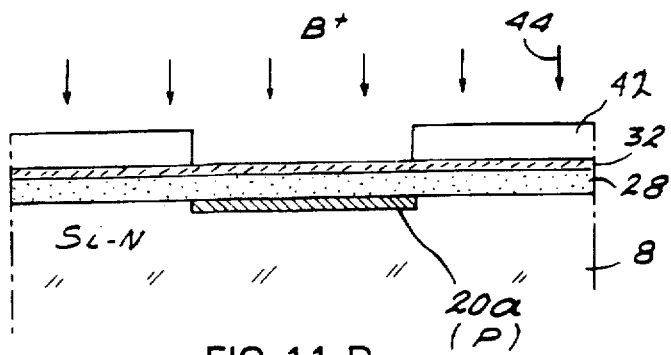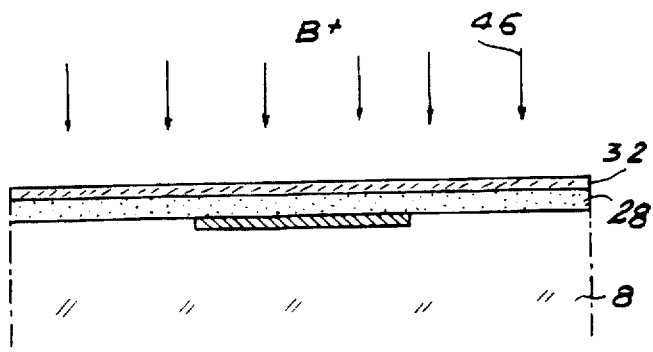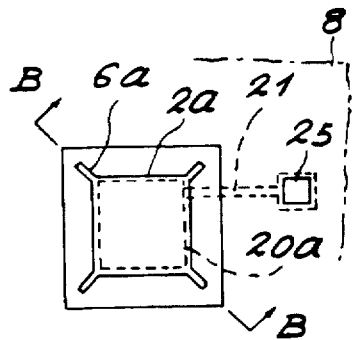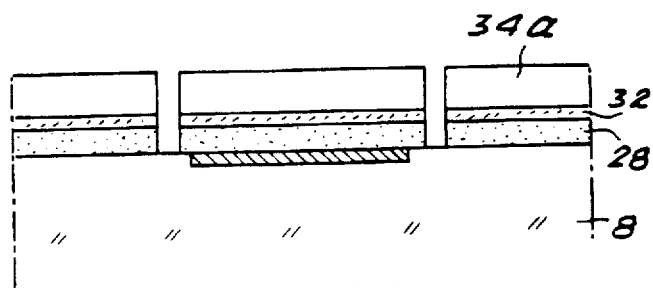

ACCELEROMETERS USING SILICON ON INSULATOR TECHNOLOGY

This is a division of application Ser. No. 08/172,827 filed on Dec.27, 1993, now U.S. Pat. No. 5,576,250.

BACKGROUND OF THE INVENTION

1. Field of the Invention

The present invention relates to a process for the production of a directional accelerometer having a sensitive axis parallel to the plane of the substrate and/or the production of a directional accelerometer having a sensitive axis perpendicular to said plane, using silicon on insulator technology.

2. Discussion of the Background

An accelerometer is an acceleration transducer essentially having a moving mass m and means for measuring the force F=mY due to the acceleration Y of a moving body on which the accelerometer is installed.

Nowadays acceleration is a parameter which is becoming increasingly useful and necessary to know for industrial requirements, particularly in the space and aeronautical fields, but also for applications in the motor vehicle sector for checking or controlling the active suspension or air bags. The development of the latter uses requires a very significant reduction in the production costs, while ensuring that the transducers still have acceptable metrological qualities.

In general terms, the accelerometers according to the invention can be used in all fields where it is desired to measure the acceleration of a body moving in one or two directions parallel to the substrate and/or one direction perpendicular to said substrate.

Numerous methods have been proposed for producing accelerometers or mechanical structures for accelerometers from micromachined silicon using microelectronics technologies.

The main advantage of silicon is clearly the collective treatment of the structures and their miniaturization, i.e. a relatively low cost price, but also the mechanical reliability the monocrystalline material which is not subject to creep, hysteresis or time drift. This significant cost reduction makes it possible to have an even broader use of such transducers or sensors, while maintaining acceptable metrological qualities.

There are two main groups of acceleration transducers, as a function of the position of the sensitive axis with respect to the semiconductor substrate. These are structures having a sensitive axis perpendicular to the substrate (called perpendicular axis structures hereinafter), which are the most widely developed and which use conventional silicon volume anisotropic chemical machining technologies, i.e. the entire thickness of the substrate is etched in order to free a monocrystalline structure. The structures having a sensitive axis parallel to the substrate (hereinafter called parallel axis structures), have the main advantage of integrating onto the same chip accelerometers sensitive to two coplanar axes and which may be perpendicular, said structures using a surface or volume technology.

Reference 1—Sensors and actuators, A21–A23 (1990), pp 297–302, "Precision accelerometers with μg resolution" by R. Rudolf et al describes the production of a perpendicular axis accelerometer using this volume method.

A parallel axis transducer using the volume method is described in reference 2—Transducers'91 Digest of Technical papers, June 1991, San Francisco, "A simple, high performance piezoresistive accelerometer" by J. T. Suminto, pp 104–107 and in reference 3—U.S. Pat. No. 4 653 326, filed in the name of the applicant.

The major disadvantages of a volume technology are the use of a double face method (few, expensive specific machines and substrates polished on both faces); a transducer shape linked with the crystalline orientation of the substrate and therefore a shape limitation; a miniaturization of the transducer limited by the substrate thickness (three-dimensional structure, one dimension being fixed); and the need to bring about a bonding of the transducer on one or more substrates requiring the use of structure support and reference cavities, which somewhat complicates the manufacture of these transducers.

In general terms, the basic principle used in silicon acceleration transducers is the measurement of the displacement or the force exerted by a seismic mass attached to a support by a flexible mechanical link, called flexible beam.

The vital quality of an accelerometer is its directivity. The latter is obtained by shape anisotropy of the mass support beams. These rectangular, varyingly long beams have a considerable flexibility along their thickness and a significant rigidity along their width. The control of the thickness of the beams, which will determine the transducer sensitivity, is the main difficulty in manufacturing the transducer.

For reasons connected with the mechanical resistance and the electrical characteristics, it is very important for the supports and the freed structure (mass) to be of monocrystalline silicon (due to the absence of creep, hysteresis, elasticity and the possibility of fitting electronic components).

In the case of a parallel axis transducer, the shape of the beams is obtained by etching a silicon substrate having a 110 orientation, for which the slow (111) etching planes are perpendicular to the substrate plane (cf. reference 2). In this case, it is a question of anisotropic etching making it possible to obtain a good geometrical definition, but which leads to a limitation of shapes in accordance with the crystalline orientation of the substrate. It also involves special substrates (polished on two opposite faces) and the use of a double face alignment method. In addition, these non-standard microelectronics substrates prevent integration on the same substrate of the associated electronics.

The significant thickness of the silicon substrate to be etched (approximately 500 μm) requires the use of very selective etching masks and relatively large final etched patterns not permitting significant miniaturization.

When the sensitive element is finished, it is then necessary to bond it onto one or more thick, rigid supports to obtain a transducer. Said support or supports are generally of a different nature from that of the substrate (e.g. glass), which leads to differential stresses prejudicial to the performance characteristics of the transducer and to a difficult supplementary stage.

Other methods have been proposed for producing parallel axis transducers in single face technology (with all the stages on the front face) using a sacrificial layer with very small geometrical shapes and a freedom with respect to the latter. They also offer the possibility of integrating two parallel axis transducers on the same substrate.

Thus, a parallel axis acceleration transducer with its integrated electronics has recently been marketed according to a surface machining method using a sacrificial layer and a polycrystalline silicon deposited layer forming the desired mechanical structure. This transducer is described in reference 4—Electronic Design, Aug. 1991, pp 45–56, "Accelerometer's micromachined mass "moves" in plane of IC; on-chip circuit controls it and senses G with force-balance techniques" by F. Goodenough.

The main limitations of this surface method are the mediocre mechanical qualities of the polycrystalline material and the significant differential thermal stresses induced by the use of two different materials (monocrystalline Si substrate and polycrystalline Si structure), which lead to transducers having limited or even inadequate metrological qualities, as well as a thickness limited to a few micrometers for the polycrystalline silicon layer forming the seismic mass, which reduces the directivity, the dimensioning possibilities and the measurement ranges of the transducer.

In addition, the mobile polycrystalline silicon mechanical structure leads to a reduction in the metrological, reproducibility and stability characteristics of the transducer.

In addition, this parallel axis transducer has a shape ratio for the beams (height/width close to 1) which is not very advantageous from the directivity standpoint and therefore has a significant sensitivity to transverse accelerations. It is the use of polycrystalline silicon, whose deposition thickness does not exceed a few micrometers (generally <2 µm), which limits the directivity and size of the seismic mass and consequently the measurement ranges.

Moreover, for the production of perpendicular axis silicon acceleration transducers, the seismic mass supports are very frequently produced by an etch stop method. Use is then made either of the etching of a solid silicon substrate by the rear face with a stop on a highly boron doped epitaxied silicon layer (cf. reference 5—J. Electrochem. Soc., vol. 137, No. 11, Nov. 1990, "Anisotropic etching of crystalline silicon in alkaline solutions: II. Influence of dopants" by H. Seidel et al, pp 3626–3632) or an electrochemical etching of the silicon substrate with etch stop on an epitaxied silicon layer forming a P/N junction with the substrate (cf. reference 6—IEEE Transactions on Electron Devices, vol. 36, No. 4, Apr. 1989, "Study of electrochemical etch-stop for high-precision thickness control of silicon membranes" by B. Kloeck et al, pp 663–669).

These two etch stop methods suffer from the disadvantages referred to hereinbefore. Thus, they use an anisotropic etching of the substrate, limiting the shapes of the sensitive elements due to the crystalline orientation of the substrate, as well as an etching from the rear face requiring the use of special substrates and a double face alignment method.

Moreover, these stop methods require the use of highly selective etching masks and, bearing in mind the inclined etching planes (54.7% for orientation 100 silicon) and the thickness of the silicon to be etched, the shapes produced on the rear face greatly exceed the final useful shapes of the component.

Other methods have been proposed for producing perpendicular axis transducers employing surface technology. These methods are more particularly described in reference 7—Sensors and Actuators, A21–A23 (1990), pp 273–277, "Monolithic silicon accelerometer" by B. Boxenhorn and P Greiff. This solution suffers from the disadvantage of using a highly doped silicon structure of approximately $10^{20}$ At/cm$^3$ which reduces the metrological qualities of the transducer. In addition, said transducer operates in torsion.

SUMMARY OF THE INVENTION

In order to overcome the above disadvantages, the invention proposes a process for the production of an accelerometer having the sensitive axis parallel to the substrate or with a sensitive axis perpendicular to the substrate, using silicon on insulator technology and associated with surface micromachining.

The silicon on insulator technology is known under the abbreviation SOI. One of the known methods uses laser recrystallization of an amorphous or polycrystalline silicon layer deposited on a silicon dioxide layer obtained by the thermal oxidation of a monocrystalline silicon substrate. A second method known under the abbreviation SDB consists of bringing about the sealing or bonding of two silicon substrates, whereof at least one has on the bonding surface a $SiO_2$ layer e.g. obtained by thermal oxidation and the thickness of one of the two substrates is then reduced to a desired thickness (cf. Technical Digest MNE'90, 2nd Workshop, Berlin, Nov. 90, pp 81–86 by C. Harendt et al, "Wafer bonding and its application to silicon-on-insulator fabrication".

A third known method is based on the high dose implantation of oxygen or nitrogen ions in solid monocrystalline silicon which, after annealing the substrate at high temperature, leads to the formation of a buried silicon nitride or silicon dioxide insulating layer supporting a monocrystalline silicon film. The oxygen ion implantation technology is known as SIMOX. The invention applies to these different SOI methods.

The process of the invention makes it possible to obtain mechanical monocrystalline silicon structures, which therefore have good metrological properties, very small dimensions and therefore a high density, so that the production costs are reduced. This process also makes it possible to produce acceleration transducers having a sensitive axis perpendicular or parallel to the plane of the substrate, which can be servo-controlled, thus ensuring a linear response, or auto-testable for calibration, with a high directivity.

The process according to the invention also permits the monolithic and collective production of microaccelerometers with complete freedom regarding the shape and structure, using a single face technology and standard silicon substrates polished on one face and of standard thickness having very small overall dimensions.

This process also eliminates the critical stage of bonding the transducer to a support of a different type, so that there is a very low cost price for each transducer.

Finally, the invention permits the integration on the same substrate and the simultaneous production of one or more accelerometers having a sensitive axis parallel to the substrate and one or more accelerometers with a sensitive axis perpendicular to the substrate.

More specifically, the invention relates to a process for the production of an integrated accelerometer having moving elements, characterized in that it comprises the following stages:

a) producing a monocrystalline silicon film on a silicon substrate and separated from the latter by an insulating layer, b) etching the silicon film and insulating layer down to the substrate in order to fix the shape of the moving elements, and c) partial elimination of the insulating layer in order to free the moving elements, the remainder of the insulating layer rendering integral the moving elements and the substrate.

This process is applicable both to the production of an accelerometer with a sensitive axis parallel to the substrate and to an accelerometer with a sensitive axis perpendicular to the substrate.

The means for the detection of the possible displacements of the moving elements may or may not be integrated into the sensitive structure. When these means are integrated, they are produced on the surface of the silicon film and partly defined during stage b). In this case, the silicon film is advantageously conductive and it is necessary to have a supplementary stage of producing electric contacts on said film.

It is advantageous to use capacitors as the means for detecting possible displacements of the moving elements. Other means for measuring these displacements such as inductive or piezoelectric means can also be used.

These capacitors are produced with the aid of one or more surface electrodes electrically insulated from the substrate.

Advantageously, the process according to the invention has a supplementary stage of epitaxying a conductive monocrystalline silicon layer on the structure obtained in b) in order to thicken said structure. Said epitaxy is performed at least at the location of the moving elements. It ensures rigidity and increases the seismic mass of the accelerometer.

This epitaxied silicon must also be doped in order to ensure an adequate electrical conductivity of the accelerometer and therefore a good detection of possible displacements of the moving elements.

The process according to the invention is applicable to all the afore-mentioned silicon on insulator methods. However, advantageously, stage a) consists of implanting oxygen ions in a conductive monocrystalline silicon substrate and then annealing the implanted substrate. The implantation of ions can take place on one or a number of occasions, each implantation being followed by the annealing of the structure.

The silicon film and optionally the substrate, when the latter constitutes the starting point for the production of the surface film, can have a N conductivity. However, it is preferable to use a P conductivity.

The moving elements consist of one or more flexible beams supporting a seismic mass, whereof one of the ends is integral with the substrate, but is electrically insulated from the latter.

In order to facilitate the partial elimination of the insulating layer, openings are made in the seismic mass of the accelerometer, defined in the silicon film and stopping on said insulating layer. This stage is performed just prior to the insulating layer elimination stage.

As stated hereinbefore, the process according to the invention is applicable both to the production of an accelerometer having a sensitive axis parallel to the surface of the substrate and to an accelerometer having a sensitive axis perpendicular to said surface.

In the case of an accelerometer having elements moving in a direction parallel to the substrate, the process of the invention advantageously comprises a stage of etching the silicon film and the insulating layer in order to form a comb-shaped electrostatic screen, which partly consists of means for measuring possible displacements of said moving elements.

For the production of an accelerometer having a sensitive axis parallel to the substrate and having at least one beam supporting a seismic mass, the beam and the mass moving in a direction parallel to the substrate, the process of the invention advantageously has the following successive stages:

1) implanting oxygen ions in a conductive monocrystalline silicon substrate, followed by the annealing of the implanted substrate, thus forming a buried oxide layer separating the conductive silicon film from the substrate, 2) etching the film-oxide layer stack down to the substrate in order to form the moving mass, the beam and part of the measuring means, 3) epitaxying a conductive silicon layer over the entire structure obtained in 2) in order to thicken the moving mass and the beam, 4) producing metal contacts on the measuring means, 5) etching the epitaxied layer and the silicon film down to the oxide layer in order to form holes in the moving mass and a comb-shaped electrostatic screen in part constituting the measuring means, 6) partly eliminating the oxide layer.

The invention also relates to a process for the production of an accelerometer having elements moving in a direction perpendicular to the substrate and advantageously involving a stage of producing a buried electrode in the monocrystalline substrate and a stage of contacting said buried electrode.

The buried electrode can be formed by locally implanting ions in the substrate having a reverse conductivity to that of the substrate. Thus, for a type N substrate, an implantation of type P ions takes place, so as to form a P/N junction.

As the moving mass has to be supported by one or more beams produced in the silicon film, it is important that these flexible beams are mechanically tensioned in the case of an accelerometer having a perpendicular axis. It is also preferable to perform a doping operation e.g. by the implantation of P type ions over the entire surface of the silicon film in the case of a N type film. This implantation creates a tensile stressing of the flexible beam or beams.

In the case of an accelerometer with a perpendicular axis, the process according to the invention comprises a stage of producing a surface electrode on the silicon film, the deposition and etching of an additional insulating layer in order to electrically insulate the substrate from the surface electrode, in order to ensure a capacitive detection.

Advantageously, the surface electrode is made from conductive polycrystalline silicon and can be of the N or P type.

The process according to the invention makes it possible to produce an accelerometer having a perpendicular axis with at least one beam supporting a seismic mass and moving in a direction perpendicular to the substrate, at least one surface electrode and at least one buried electrode. In this case, the process comprises the following successive stages:

i) implanting oxygen ions in a conductive monocrystalline silicon substrate having a first conductivity type and then annealing the implanted substrate, thus forming a buried oxide layer separating the conductive silicon film from the substrate, ii) forming a buried electrode in the substrate, iii) etching the film-oxide layer stack down to the substrate in order to form the moving mass, the bean and contacting the buried electrode, iv) forming studs on the moving mass and on the bean, which can be selectively eliminated with respect to the silicon, v) electrically insulating the structure obtained in iv) at the location provided for the surface electrode by an additional electrical insulator, vi) epitaxying a conductive monocrystalline silicon layer on the mass in order to thicken and deposit polycrystalline silicon at the location provided for the surface electrode, vii) producing metal contacts for the surface electrode and the buried electrode, viii) etching the epitaxied silicon-silicon film stack down to the oxide in order to form openings in the moving mass, ix) eliminating the studs and in part the oxide layer.

In order to eliminate the insulating studs or blocks and the oxide layer in simultaneous manner, said studs are advantageously made from silicon dioxide.

The process according to the invention makes it possible to simultaneously produce on the same semiconductor substrate one or more accelerometers having elements moving in a direction parallel to the substrate and one or more accelerometers having elements moving perpendicular to the substrate. In this case, the stages specific to the production of accelerometers having elements moving in a direction perpendicular to the substrate and in particular stages ii), iv), v) are performed by masking the regions of the substrate intended for the production of accelerometers with a sensitive axis parallel to the substrate.

BRIEF DESCRIPTION OF THE DRAWINGS

Other advantages and features of the invention can be gathered from the following non-limitative description and with reference to the attached drawings, wherein show:

FIGS. 11A, 11B, 12, 13A, 13B, 14A, 14B, 15A, 15B, 16A, 16B, 17A and 17B The different stages of the production of the accelerometer of FIGS. 9 and 10: FIGS. 11B, 12, 13B, 14B, 15B, 16B and 17B being sectional views, whereas figs. 11A, 13A, 14A, 15A, 16A and 17A are plan views.

DESCRIPTION OF THE PREFERRED EMBODIMENTS

The following description is provided with respect to the SIMOX method, as well as the use of a N type monocrystalline substrate, but as has been stated hereinbefore, it is possible to consider other silicon on insulator methods and the use of a P type substrate.

1) Accelerometer with Sensitive Axis Parallel to the Substrate

Figure 1:
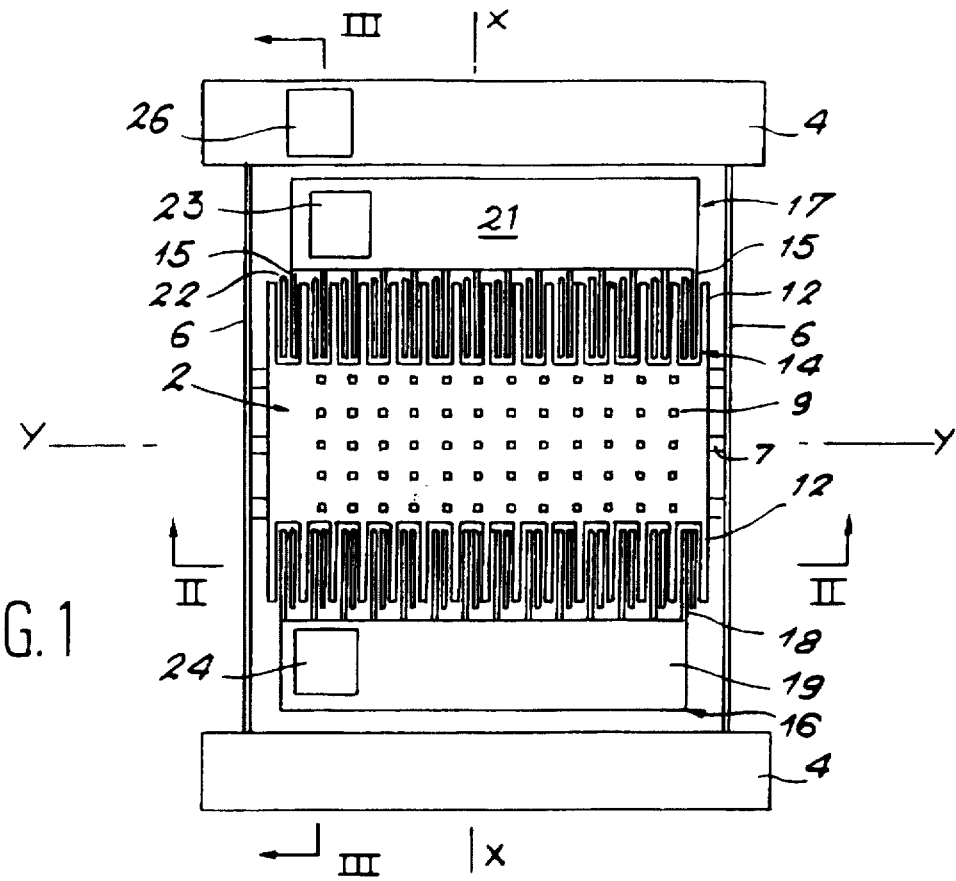
FIG. 1 Diagrammatically in plan view an accelerometer having a sensitive axis parallel to the substrate and produced according to the process of the invention.
Figure 2:
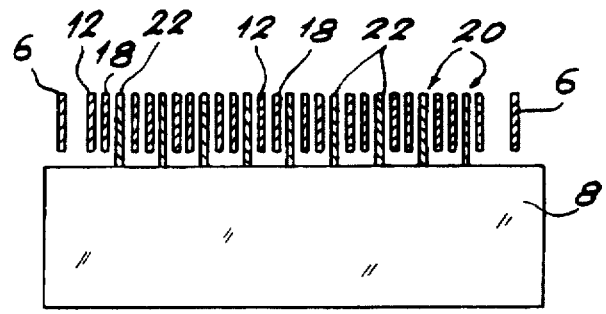
FIG. 2 A sectional view in direction II—II of FIG. 1.
Figure 3:
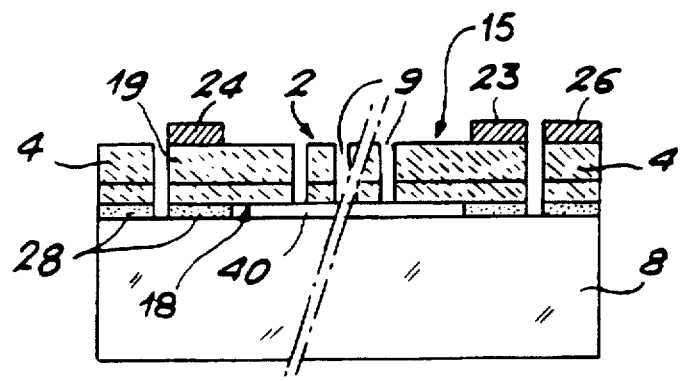
FIG. 3 A sectional view along line III—III of FIG. 1.

With reference to FIGS. 1, 2 and 3, a description is given hereinafter of the production of an embodiment of an accelerometer having the sensitive axis parallel to the substrate.

This accelerometer comprises a mobile, P doped monocrystalline silicon seismic mass 2, connected by flexible beams 6 to fixed support elements 4. This mass 2 has through holes 9 and projecting portions 7 ensuring its connection to the beams. The interest of these holes will become more apparent hereinafter.

The elements 4 are integral and insulated from a substrate 8. The elements 4 and the beams 6 are made from P type monocrystalline silicon, whereas the substrate 8 is of N type monocrystalline silicon.

In FIG. 1 the accelerometer has two support elements 4 on either side of the seismic mass 2, connected by two beams 6 oriented perpendicular to the elements 4. Therefore this structure is symmetrical with respect to the two perpendicular axes X and Y positioned parallel to the surface of the substrate 8.

However, it is possible to produce an accelerometer only having the upper left-hand quarter of the structure and which also functions.

The seismic mass 2 of the accelerometer of FIG. 1 has on either side of the axis Y electrodes 12 shaped like teeth and which are oriented parallel to the direction X. They constitute two first, mobile combs 14. Facing each first comb 14 and offset with respect thereto, there is a second fixed comb 16 or 17, whose teeth 18 or 15 serving as electrodes are parallel to the direction X and secured between the teeth 12 of the comb 14. These combs 16 and 17 are also made from P doped monocrystalline silicon and are joined to the substrate 8 by their solid portion 19 and 21 (FIG. 3).

As a result of their conductive property, the teeth 12 and 18 or 15 constitute the plates of variable capacitance capacitors. Thus, when the beams 6 move parallel to the substrate 8 in direction Y, the moving teeth 12 move in said direction Y, whereas the teeth 18 and 15 remain fixed, thus modifying the space separating a tooth 12 from the tooth 18 or 15 facing the same and therefore the capacitance of the corresponding capacitor.

The variation of the capacitance of each capacitor is proportional to the displacement in direction Y. Thus, by measuring said capacitance variation, it is possible to know the displacement of the beams in direction Y. Apart from those of the lateral ends, with each tooth 12 correspond two variable capacitances varying in reverse directions.

Moreover, in order to only associate a single capacitance value for each tooth 12 and as a result of the symmetry relative to the direction Y, electrostatic screens 20 essentially constituted by teeth 22 parallel to the direction Y are provided on either side of said direction. Each tooth 22 is placed between a moving tooth 12 and a fixed tooth 18 or 15.

Each electrostatic screen is made from an electricity conducting material and is e.g. preferably of P doped monocrystalline silicon and this preferably takes place at the same time as the mass, the beams 6 and the electrodes 18 and 15.

As shown in FIG. 2, the fixed electrodes 22 of the electrostatic screens are in direct contact with the substrate 8 and are therefore electrically connected to the latter. However, as shown in FIG. 3, the support elements 4 of the beams 6 and the solid portions 19 and 21 of the fixed combs 16, 17 are electrically insulated from the substrate 8 by an etched silicon dioxide layer 28.

The seismic mass 2 is suspended above the substrate 8. The reference 40 indicates the space separating the mass 2 from the substrate 8.

The arrangement of the electrodes or teeth 12 and 18 or 15 and the electrostatic screens 20 permits a differential measurement of the displacements of the mass 2 supported by the beams 6 in the direction Y, as well as a servocontrol of the measurement.

In order to measure the capacitance variations of the capacitors 12–18, a reference electric contact 23 or 24 is provided on the combs respectively 17 or 16. There is also a measuring electric contact 26 on one of the support elements 4 in order to ensure the differential measurement.

Under the effect of an acceleration in direction Y, the seismic mass 2 is subject to a force (F=mY), which makes it move in accordance with the stiffness of the beams 6 by a distance l parallel to Y. The capacitances measured between these electrodes 12 integral with the seismic mass 2 and the fixed electrodes 18 and 15 (serving as abutments in the case of an overload) of the "interdigitated" combs 16, 17 and 14 vary in opposite manner.

The interposing of an electrode 22 of an electrostatic screen 20 between the face of a fixed electrode 18 or 15 and a face of a moving electrode 12 makes it possible to associate a single variable capacitance capacitor with each moving tooth and therefore cancel out the parasitic capacitance effect.

Electrically, the three series of electrodes 12, 18 or 15, 22 are insulated and under the effect of an electric field E applied between the seismic mass 2, via the contact 26, and one of the two electrodes 18 or 15, respectively via the contact 24 or 23, an electrostatic attraction force is created.

For measurement servocontrol, use is made of a measuring device connected between the contacts 24 or 23 and 26, which detects the differential capacitance variation induced by the displacement of the seismic mass along Y during an acceleration. This capacitance meter-type device produces a low amplitude, alternating measurement signal.

On this is then superimposed a continuous polarization applied via the contacts 24 or 23 and 26 between the electrodes 12 and 18 or 15 (which undergo a capacitance reduction) making it possible to exert an electrostatic force equal to that created by the acceleration in accordance with Y and which brings the mass to its equilibrium position and therefore to the initial capacitance of each variable capacitor.

Therefore this polarization is the image of the acceleration in accordance with Y and makes it possible to obtain a transducer having a very considerable linearity and the use thereof for an auto-test of the structure.

In order to independently measure an acceleration in direction X, it is merely necessary to form on said sane substrate 8 an accelerometer of the type shown in FIGS. 1 to 3, but orienting it in a perpendicular direction, so that the beams 6 and teeth 12, 18 and 22 are oriented parallel to Y. In this case, it is possible to detect an acceleration in direction X by the displacement of the seismic mass parallel to X.

Figure 4:
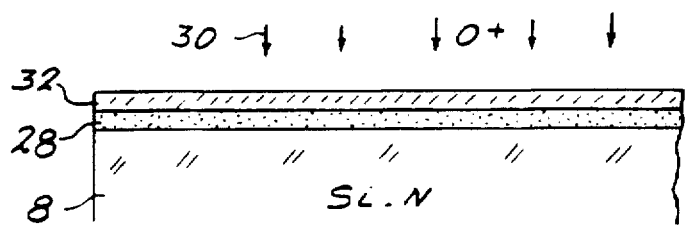
FIGS. 4 to 8 Diagrammatically the different production stages according to the invention for the accelerometer of FIG. 1, FIGS. 4, 5, 6 and 8 being sections in direction II—II of FIG. 1 and FIG. 7 a section in direction III—III of FIG. 1.

2) Production of the Accelerometer with the Sensitive Axis Parallel to the Substrate The first stage of the process shown in FIG. 4 consists of forming a stack of the silicon on insulator type on the substrate 8. To this end, implantation takes place of oxygen ions 30 (O+or $O_2$+) in the N doped monocrystalline substrate 8 having a random orientation (100, 110, 101) at a dose of $10^{16}$ to $10^{18}$ ions/cm, followed by the annealing of the implanted structure at a temperature between 1150° and 1400° C. This oxygen implantation and said annealing can be repeated several times. The implantation energy is between 100 and 1000 KeV.

This mono- or multi-implantation followed by annealing makes it possible to obtain a buried, homogeneous oxide layer 28 over the entire surface of the substrate 8 and a N monocrystalline silicon surface layer 32.

For example, the thickness of the $SiO_2$ layer 28 is approximately 400 nm and that of the surface silicon layer 32 approximately 150 nm using three oxygen implantations at a dose of $10^{18}$ ions/cm and an energy of 200 KeV.

This is followed by a P type doping of the entire silicon film 32 in order to tensile stress it e.g. by implanting boron ions (FIG. 12) at a relatively low energy of approximately 30 KeV, so as to only bring about surface penetration of the film 32, with a dose of a few $10^{14}$ At/cm$^2$ (typically $2\times10^{14}$). In the case of an initial P type substrate, this implantation is not necessary.

Figure 5:
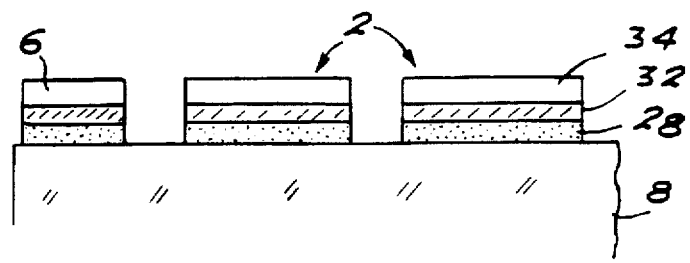

The following stage of the process shown in FIG. 5 consists of etching the layers 32 and 28 down to the substrate 8 in accordance with a desired pattern making it possible to fix the general shape of the electrostatic screens 20 and the seismic mass 2.

This etching takes place by reactive ionic etching e.g. using $SF_6$ and $CHF_3$ respectively for the silicon 32 and the oxide 28. This etching is carried out independently of the crystalline orientation of the substrate using conventional photolithography methods and in particular a resin mask 34 representing the desired pattern.

Figure 6:
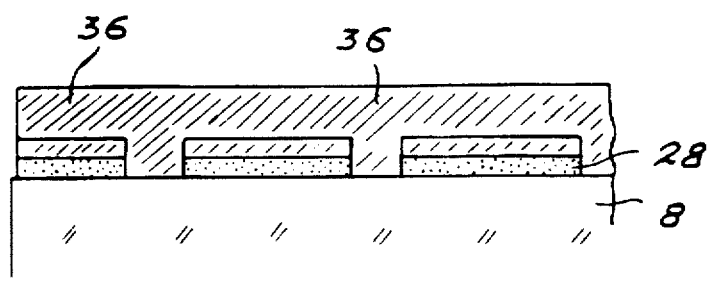

Following elimination of the mask 34 by chemical etching, epitaxy takes place on the complete structure of a P doped monocrystalline silicon layer 36 over a thickness of 1 to 100 µm as a function of the sensitivity desired for the accelerometer (typically 10 to 20 µm) and with a view to rigidifying the structure and in particular the beams 8 and for obtaining an adequate seismic mass. This epitaxy is performed in the vapor phase and the structure obtained is that of FIG. 6.

This is followed by the deposition of a metal layer on the complete structure in order to ensure the interconnections with the measuring circuits and the provision of the contacts 23, 24 and 26. This metallization has a thickness of approximately 0.5 µm and can be of aluminium, gold or a multilayer stack of type Ti—Ni—Au and is generally of a metal having a resistance during the silicon dioxide etching process. In the case of a three-layer metallization the titanium layer acts as the ohmic contact on the silicon, the nickel acts as a diffusion barrier and the gold ensures the electrical conduction.

Figure 7:
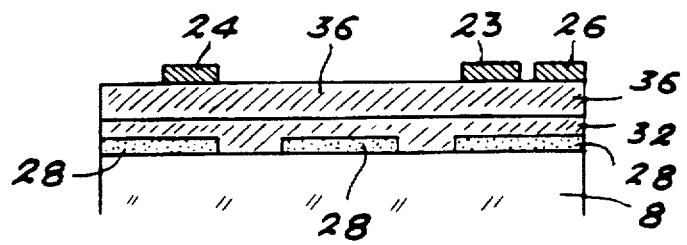

This metal layer is then etched in order to form the contacts 23, 24 and 26 respectively on the silicon portions 19 and 21 and the support elements 4. For a three-layer metallization, it is possible to use a wet chemical etching with e.g. a mixture of iodine and potassium iodide for etching the gold, $(NH_4)_2S_2O_8$ in $H_2SO_4$ for etching the nickel and a 1 vol. % H F solution for etching the titanium. The structure obtained after etching is that shown in FIG. 7.

Figure 8:
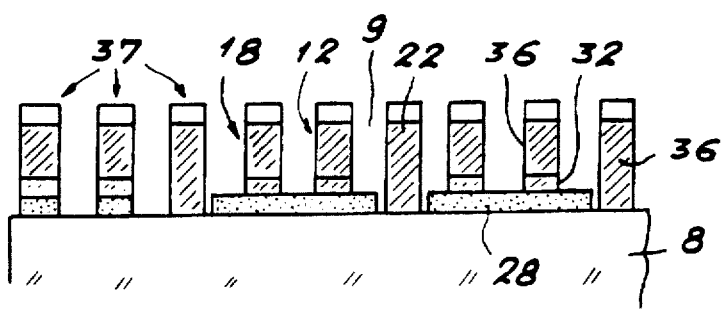

As shown in FIG. 8, this is followed by an etching of the epitaxied layer 36 and then the silicon layer 32 down to the silica layer 28 and even down to the substrate 8 level with the electrostatic screen. This etching is a dry anisotropic etching, e.g. reactive ionic etching using a mixture of $CCl_4+N_2$ for the silicon and $CHF_3$ for the oxide. It is performed in accordance with standard photolithography processes, using an appropriately shaped $SiO_2$ or resin mask 37.

This mask defines the shape of the teeth 22 of the electrostatic screens, the teeth 12 of the seismic mass and the fixed teeth 18 and 15. Moreover, as shown in FIG. 1, said etching creates holes 9 in the solid portion of the seismic mass 2 over the entire silicon part (FIG. 3).

After eliminating the mask 37, the following stage of the process consists of freeing the mobile elements of the accelerometer and consequently the seismic mass 2 equipped with its combs 14, as well as the flexible beams 6 by etching the silica layer 28 in a hydrofluoric acid-based solution as from the edges of the structure and the holes 9. The structure obtained is then that shown in FIGS. 2 and 3.

This etching is carried out in part in such a way that the beams 6 are supported by the substrate 8, while being insulated from the latter. The holes 9 are made in order to permit a rapid etching of the buried layer 28 under the seismic mass 2, without any significant overetching in the zones which are not to be freed and in particular below the supports 4 and the solid elements 19 and 21 of the combs 16 and 17 with fixed electrodes 18 or 15. This is followed by the rinsing and drying of the thus obtained structure.

The SIMOX method used makes it possible to form a sacrificial oxide layer 28 of homogeneous thickness which, after elimination, makes it possible to free the monocrystalline silicon structure from above while forming an air gap 40 (FIG. 3), which is perfectly controlled and narrow between the substrate 8 and the silicon 32, whose bottom can be used as a mechanical abutment in the case of an overload.

3) Accelerometer with a sensitive axis perpendicular to the substrate.

Figure 9:
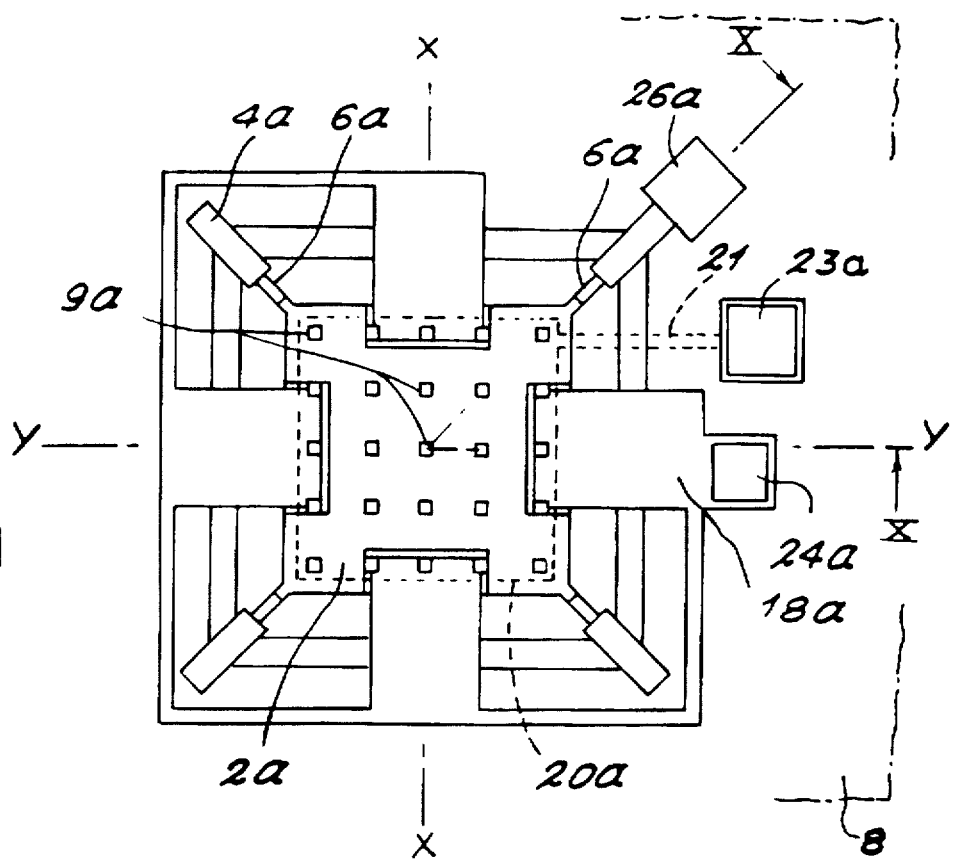
FIG. 9 A plan view of an accelerometer with a sensitive axis perpendicular to the substrate produced according to the process of the invention.
Figure 10:
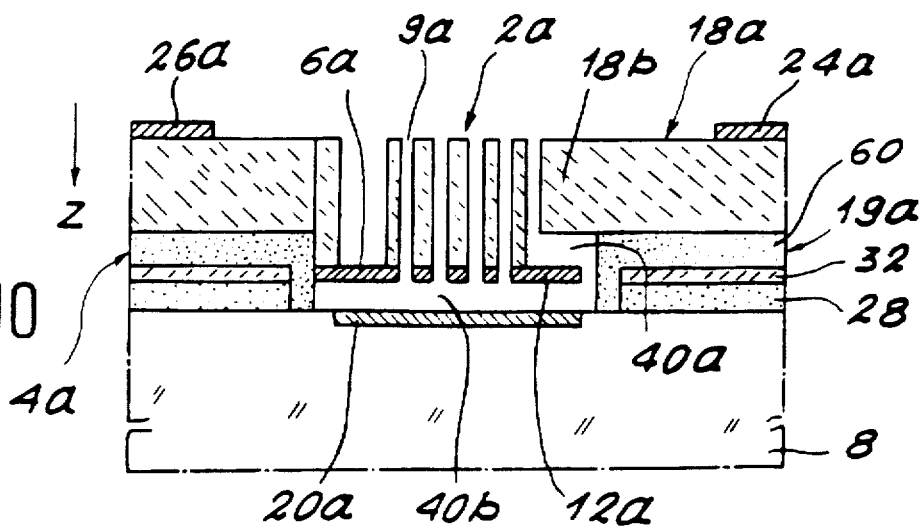
FIG. 10 A sectional view in direction X—X of FIG. 9.

For the rest of the description, the elements fulfilling the sane function as those described hereinbefore with reference to FIGS. 1 to 8 will carry the same reference number followed by the letter a. In addition, as this accelerometer can be produced on the same substrate as that described hereinbefore and simultaneously, the materials, as well as their deposition procedure and etching will be the same. This accelerometer is shown in plan view in FIG. 9 and in section in FIG. 10, in direction X—X of FIG. 9.

As previously, said accelerometer has a symmetrical configuration, but it is possible to only use the upper left-hand quarter of the structure shown for the detection of an acceleration in a direction Z perpendicular to the substrate.

This accelerometer has a square seismic mass 2a in the plane XY equipped with its holes 9a. This seismic mass 2a is mechanically connected by beams 6a to support elements 4a integral with the substrate 8, but insulated from the latter by the oxide layer 28.

The seismic mass 2a is equipped with diaphragms 12a moving in the direction Z and there are four diaphragms here located on the sides of the seismic mass 2a. The diaphragms 12a serve as moving electrodes for the capacitive detection and the servocontrol of said measurement. Like the beams 6a, the diaphragms 12a are made from monocrystalline silicon and have a thickness less than 1 micrometer, e.g. approximately 0.22 µm.

On either side of these moving electrodes 12a, there is an upper fixed electrode 18a, whose projecting portion 8b serves as the upper abutment. These electrodes 18a are made from P doped polycrystalline silicon.

There is a homogeneous space 40a separating the electrode 18a and the electrode 12a. There is also a homogeneous space 40b separating the electrode 12a and the electrode 20a. These electrodes 18a are supported by support elements 19a electrically insulated from the substrate 8.

Above the electrodes 18a, there are metal contacts 24a and above the supports 4a of the beams measurement metal contacts 26a.

Advantageously, although not necessary, there is a P type buried electrode 20a below the seismic mass 2a. The use of a buried electrode 20a is a preferred solution, because it permits measurements, while eliminating parasitic capacitances. However, the accelerometer can function without this buried electrode. In this case, it is replaced by the substrate, which is a P type conductor.

Contacting on the electrode 20a takes place laterally by means of an electric link 21 installed in the substrate and a metal contact 23a on the surface.

A description will now be given of the operation of the acceleration transducer with a sensitive axis along Z. Under the effect of an acceleration along Z, the seismic mass 2a is subject to a force (F=mY) which moves it in accordance with the stiffness of the beams 6a by a distance l parallel to Z. The capacitances measured between the electrodes 12a integral with the seismic mass and the electrodes constituted by the upper abutments 18b and the substrate 8 will vary in opposition.

Electrically, the three types of electrodes 12a, 18a and 20a are insulated and under the effect of an electric field E applied between the seismic mass 2a, via the contact 26a, and one of the two electrodes 18a or 20a, respectively via the contact 24a and 23a, an electrostatic attraction force is created.

For a servocontrol, use is once again made of a measuring device connected to the contacts 24a, 23a and 26a, which detects the differential capacitance variation induced by the displacement of the seismic mass along Z during an acceleration.

As previously, this device produces a low amplitude, alternating measurement signal which is superimposed on a continuous polarization applied to the electrodes 12a and 18a via the corresponding electric contacts 24a, 26a creating a force equal to that created by the acceleration along Z and which brings the mass to its equilibrium position.

4) Production of the Accelerometer with the Sensitive Axis in a Direction Perpendicular to the Substrate The first stage shown in FIGS. 11a–11b consists of producing the stack formed by the monocrystalline silicon 32 and the oxide layer 28 on the N type substrate 8 in the same way as described relative to FIG. 4.

The following stage shown in FIGS. 11a and 11b relates to the production of a buried electrode in the substrate 8. For this purpose, a photolithographic mask 42 is formed by conventional processes fixing the image of the electrode 20a to be produced in the substrate, as well as its electrical connection 21, outside the sensitive area of the accelerometer, with a view to subsequent contacting.

Through the mask 42, there is a high energy, deep boron implantation 44 under the buried oxide layer 28. The implantation conditions can e.g. be a dose of $5 \times 10^{14}$ At/cm$^2$ at an energy of 240 keV, in order to obtain a P type doped area having a good electrical conductivity and a thickness of approximately 0.3 µm just below the buried layer 28, this taking place in the area not masked by the resin 42. The latter must be sufficiently thick to block implantation on undesired areas. A photosensitive resin thickness of e.g. 2 µm could be used. Once this implantation has taken place, the mask 42 is removed e.g. by chemical etching.

As the mobile structure 2a has to be supported by the beams 6a produced in the thin silicon film 32, it is important that these flexible supports are mechanically tensioned. This tensile stress can be obtained when the silicon is of the P type. As the silicon film 32 is of the N type, as a result of the initial choice of the substrate 8, it is then necessary to P dope it. This doping is performed, as shown in FIG. 12, by implanting P type ions over the entire surface of the silicon film 32. This implantation 46 can be performed with boron ions under the conditions described hereinbefore.

The following stage of the process shown in FIGS. 13A and 13B consists of etching the stack formed by the silicon film 32 and the oxide layer 28 down to the substrate 8 using an appropriately shaped mask 34a. This mask 34a more particularly fixes the shapes of the seismic mass 2a, the beams 6a and that of the contact holes 25 for subsequent contacting with the buried electrode 20a. This etching of the two-layer stack is performed under the same conditions as described relative to FIG. 5.

Figure 14:
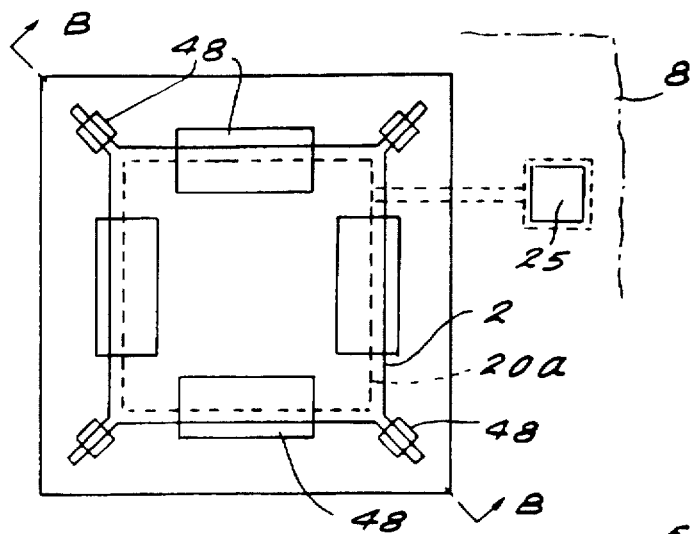
Figure 14:
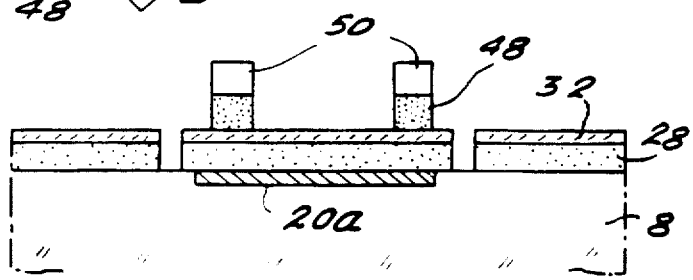

The following stage of the process is shown in FIGS. 14A and 14B and consists of depositing on the complete structure an insulating layer 48, e.g. of $SiO_2$ having a thickness generally equal to that of the buried oxide 28. The oxide is etched in accordance with conventional photolithography processes using a mask 50. The layer 48 can be deposited by plasma assisted chemical vapor deposition and then etched e.g. chemically using a hydrofluoric acid solution or by dry etching (GIR) using $CHF_3$.

The etched layer 48 protects the beams 6a to be produced in the remainder of the process and also fixes the air gaps 40a between the mobile electrodes 12a and the upper, fixed electrodes 18a.

Figure 15:
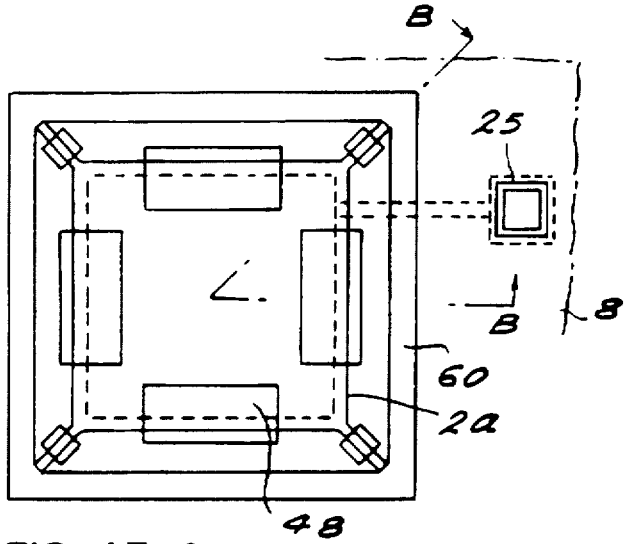
Figure 15:
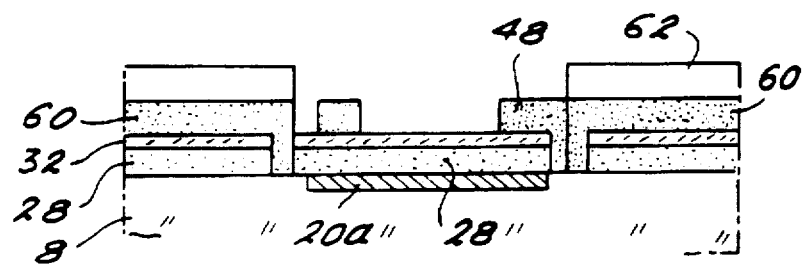

After eliminating the resin mask 50 and as shown in FIGS. 15A and 15B, a further electrical insulating layer 60 is deposited on the complete structure and is to be selectively etched relative to the protective layer 48 and the oxide layer 28. This layer 60 can be made from silicon nitride or silicon oxynitride and can be deposited by low pressure chemical vapor deposition over a thickness of approximately 0.5 M.

The layer 60 is then etched using a new, appropriately shaped resin mask 62. The mask 62 fixes the dimensions of the insulators to be produced in the layer 60 in order to electrically insulate from the conductive substrate 8 and silicon film 32 the electrodes 18a and contact hole 25. The layer 60 is etched by reactive ionic etching using a mixture of $CHF_3+SF_6$ until the surface silicon 32 is exposed.

Figure 16:
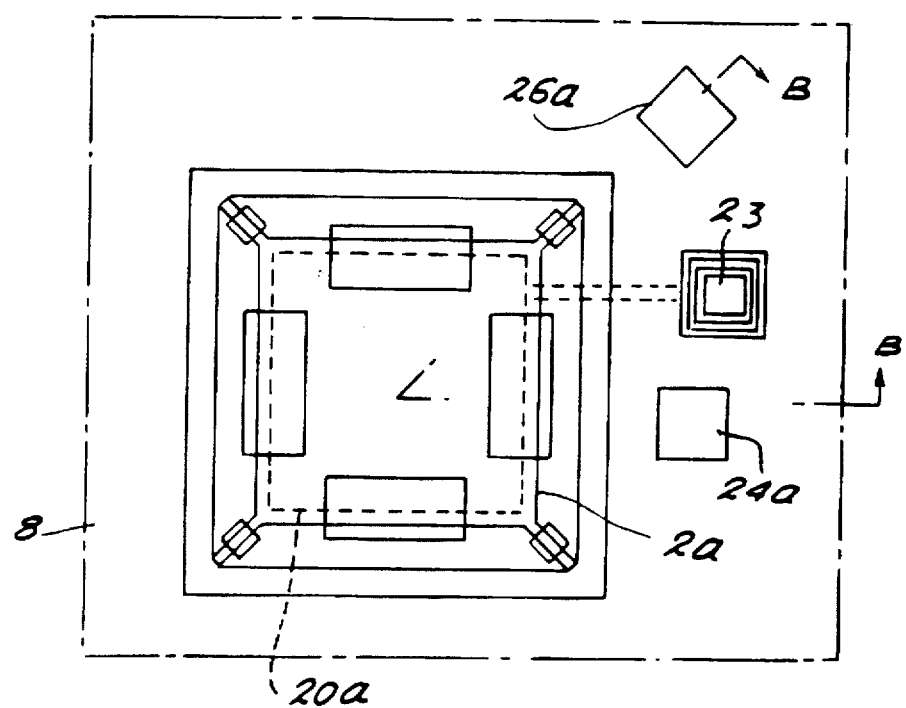
Figure 16:
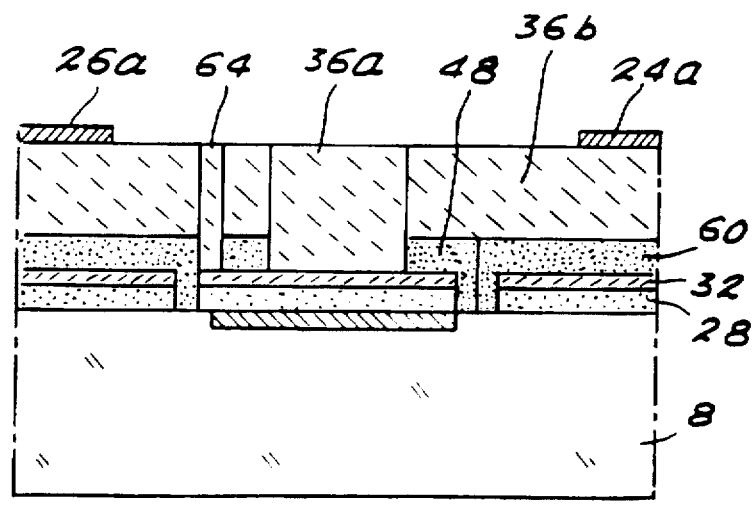

After eliminating the mask 62 the complete structure is covered with conductive silicon in the manner shown in FIGS. 16A and 16B, so that the seismic mass 2a becomes thicker and the upper electrodes 18a are formed.

This stage consists of epitaxying a P doped silicon layer with a thickness of 1 to 100μm on the entire surface of the substrate or optionally depositing a P doped polycrystalline silicon layer on the complete surface, whose thickness is at present limited to 2 or 3 μm due to the methods used.

Silicon epitaxy (no matter what the method used) leads to the formation of a monocrystalline material 36a over all the areas with monocrystalline silicon contact and a polycrystalline material 36b in the areas covering the silicon nitride layer 60 or the insulating studs 48. Thus, all the critical parts of the structure such as the seismic mass 2a and the fitting area 64 for the beams 6a are made from monocrystalline silicon.

On the structure obtained is then deposited the metal layer for inter-connection and contacting, which is etched in accordance with the desired patterns for producing the different metal contacts 26a, 23 and 24a.

This metal layer can be a gold layer or a titanium-nickel-gold multi-layer. The shape of the contacts is then produced by chemical etching using an appropriate resin mask. The multi-layer must be able to resist the etching of the silica using a hydrofluoric acid-based solution.

Figure 17:
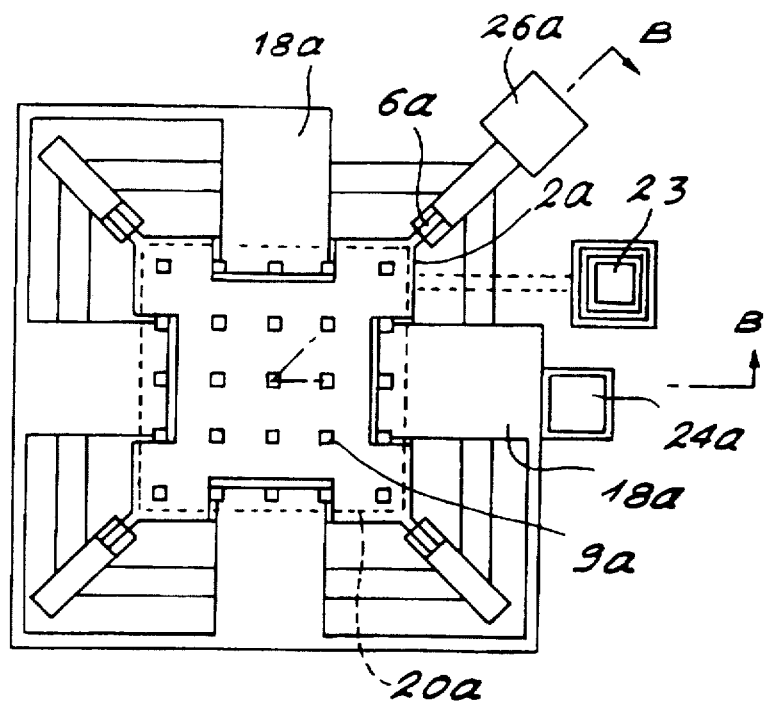
Figure 17:
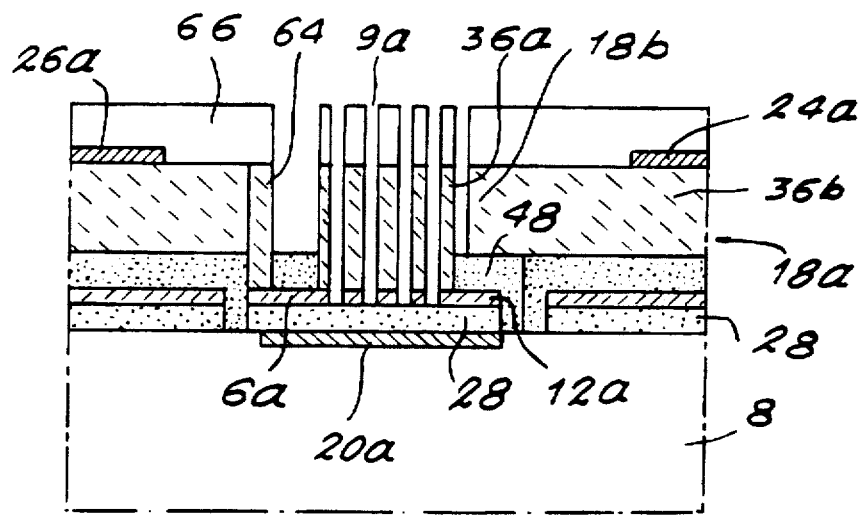

The following stage of the process is shown in FIGS. 17A and 17B and consists of etching the silicon 36a, 36b and 32 with the aid of an appropriate mask 66 fixing the dimensions of the flexible beams 6a, the fitting 64 of the beams, the mobile electrodes 12a and the electrodes 18a equipped with their abutments 18b. This etching also leads to the formation of holes 9a, which will give the structure an optimum mechanical damping action.

The density of the holes makes it possible to adjust the cutoff frequency of the accelerometer within a wide acceleration range without modifying the dimensions of the basic structure.

These etching operations take place down to the buried oxide 28 beneath the seismic mass 2a. The mask 66 used for the etching operations can be a photosensitive resin mask or optionally an oxide deposit etched in accordance with the desired shape. Etching takes place by the dry anisotropic process using $SF_6$ or a gaseous mixture of $CCl_4+N_2$.

This is followed by the elimination of the insulating studs 48 and the partial elimination of the buried layer 28, so as to free the mobile elements of the accelerometer and in particular the beams 6a, the mobile mass 2a and the electrodes 12a. Elimination takes place in a HF-based solution from the edges of the structure and the orifices 9a. The structure is then rinsed and dried.

The SIMOX method used makes it possible to produce an air gap 40b (FIG. 10), which is in a well controlled form, so that it is possible to obtain a high value capacitance. Moreover, the flexible beams 6a on leaving the sensitive mass are produced in the surface silicon layer with a thickness of approximately 0.2 μm, so that the accelerometer has a high sensitivity.

As a result of the invention it is possible to produce on the same substrate an accelerometer sensitive to the Z axis substrate as described relative to FIGS. 9 to 17B and accelerometers with a sensitive axis parallel to the substrate as described relative to FIGS. 1 to 8.

The different accelerometers can be produced simultaneously. In this case, it is necessary to provide a masking of the areas of the substrate which are to be used for producing accelerometers sensitive in accordance with the X or Y axis during the implantation stages of the buried electrode (FIGS. 11A and 11B).

The other stages are performed simultaneously on the complete substrate, even with respect to the deposits of insulating studs 48 and silicon nitride 60, because the shape of these insulators is fixed by etching through appropriate masks 50 and 62.

Therefore the process of the invention permits the mass production in a simple and reproducible manner of several accelerometers, thus reducing their manufacturing costs and permitting their use in numerous fields of application.

The preferred embodiments of the accelerometers described have only been given for illustration and other forms can be envisaged.

Figure 18:
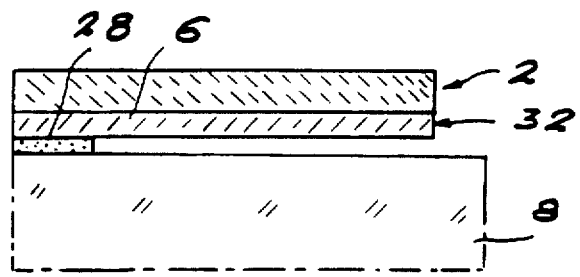
FIG. 18, in section, the principle of an accelerometer.

In simplified manner, an accelerometer produced according to the process of the invention has, as shown in FIG. 18, a flexible beam 6 of doped monocrystalline silicon, integral with the substrate 8, at one of its ends and etched via the insulating layer 28. When the beam is sufficiently heavy (i.e. wide and thick), it can serve as a seismic mass. However, it is preferable to equip the beam 6 with a supplementary mass 2, which is also of monocrystalline silicon.

There are also means for measuring deformations of the beam 6, which may or may not be integrated into the substrate 8.

Thus, in its general principle, the process of the invention consists of producing the silicon film 32 on the substrate 8 separating them by an electrical insulating layer 28 using the silicon on insulator method. This is followed by the optional epitaxying of a monocrystalline silicon layer on the beam 6 in order to thicken it. The structure is then etched down to the substrate 8 in order to form the moving beam 6 and the moving mass, followed by the partial elimination of the insulating layer 28 to free the bean and the moving mass 2.

We claim:

1. An accelerometer comprising:
   a monocrystalline silicon film;
   a silicon substrate;
   an insulating layer; and
   moving elements etched through said monocrystalline silicon film;
   said insulating layer separating the monocrystalline silicon film from the silicon substrate, and portions of the insulating film being removed in order to free the moving elements, wherein at least one first moving element of said monocrystalline silicon film has a sensitive axis perpendicular to the substrate and at least one second moving element of said monocrystalline silicon film has a sensitive axis parallel to the substrate.

2. An accelerometer according to claim 1, wherein the moving elements comprise a seismic mass.

3. An accelerometer according to claim 2, further comprising fixed support elements, insulated from the substrate and beams connecting the seismic mass to the fixed support elements.

4. An accelerometer according to claim 1, further comprising measuring means for measuring displacements of said moving elements, said measuring means being integrated onto the substrate.

5. An accelerometer according to claim 1, wherein the monocrystalline slicon film is of an N type.

6. An accelerometer according to claim 4, wherein the measuring means comprises a comb-shaped electrostatic screen.

7. An accelerometer comprising:

a monocrystalline silicon film on a silicon substrate, said monocrystalline silicon film being separated from the silicon substrate by an insulating layer; and at least one first moving element having a sensitive axis perpendicular to the substrate and at least one second moving element having a sensitive axis parallel to the substrate.

* * * * *